United States Patent [19]
Kimura

[11] Patent Number: 6,028,356
[45] Date of Patent: *Feb. 22, 2000

[54] PLASTIC-PACKAGED SEMICONDUCTOR INTEGRATED CIRCUIT

[75] Inventor: Naoto Kimura, Kumamoto, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/962,771

[22] Filed: Nov. 3, 1997

Related U.S. Application Data

[62] Division of application No. 08/791,770, Jan. 29, 1997, Pat. No. 5,715,593.

[30] Foreign Application Priority Data

Jan. 30, 1996 [JP] Japan ................................ 8-13874

[51] Int. Cl.[7] ............................ H01L 23/31; H01L 23/48
[52] U.S. Cl. ...................... 257/730; 257/780; 257/729; 257/786
[58] Field of Search ................................. 257/729, 730, 257/692, 693, 780, 778, 786

[56] References Cited

U.S. PATENT DOCUMENTS

| | | | |
|---|---|---|---|
| 5,506,756 | 4/1996 | Haley | 361/789 |
| 5,508,556 | 4/1996 | Lin | 257/780 |
| 5,663,594 | 9/1997 | Kimura | 257/666 |
| 5,677,566 | 10/1997 | King et al. | 257/666 |
| 5,874,784 | 2/1999 | Aoki et al. | 257/692 |
| 5,925,934 | 7/1999 | Lim | 257/778 |

FOREIGN PATENT DOCUMENTS

| | | |
|---|---|---|
| 6-349893 | 12/1994 | Japan . |
| 8-83878 | 3/1996 | Japan . |
| 8-148629 | 6/1996 | Japan . |
| 8-148603 | 7/1996 | Japan . |
| 9-116045 | 5/1997 | Japan . |

*Primary Examiner*—John Guay
*Attorney, Agent, or Firm*—Young & Thompson

[57] ABSTRACT

There is provided a plastic-packaged semiconductor integrated circuit including (a) an inner lead having a lead-on-chip (LOC) type structure, (b) a ball grid array (BGA) type terminals for electrically connecting the inner lead to an external circuit, and (c) an outer package made of thermosetting resin for shielding the inner lead therein. Specifically, the plastic-packaged semiconductor integrated circuit includes (a) a pellet on which an electronic circuit is mounted and at a surface of which are formed at least one bonding pad, (b) at least one inner lead disposed partially overlapping the pellet so that one end thereof is located on the inner lead and the other end is exposed outside through thermosetting resin layer, the inner lead being wire-bonded with the bonding pad, (c) a thermosetting resin layer for packaging the pellet and the inner lead therein, and (d) at least one solder ball formed in a hole formed throughout the resin layer so that the solder ball is electrical contact with the inner lead, the solder ball having a head projecting above the resin layer. The above mentioned plastic-packaged semiconductor integrated circuit does not need to have outer leads, resulting in that an extra space is no longer necessary for extending outer leads outside a package. Hence, it is possible to make a package smaller in size. In addition, an outer package can be made of thermosetting resin that is high moisture proof, and the inner lead is exposed outside at its one end, so that moisture contained in the package can escape through the inner lead. Thus, the plastic-packaged semiconductor integrated circuit ensures high moisture proof properties and a smaller size.

1 Claim, 6 Drawing Sheets

PLASTIC-PACKAGED SEMICONDUCTOR INTEGRATED CIRCUIT

This application is a divisional of application Ser. No. 08/791,770, filed Jan. 29, 1997, now U.S. Pat. No. 5,715,593.

BACKGROUND OF THE INVENTION

1. Field of the Invention

The invention relates to a plastic-packaged semiconductor integrated circuit, and more particularly to a TSOP (thin small outline package) type semiconductor integrated circuit having a LOC (lead on chip) structure. The invention also relates to a method of fabricating such a plastic-packaged semiconductor integrated circuit.

2. Description of the Related Art

An example of plastic-packaged semiconductor integrated circuits having a LOC structure is illustrated in FIG. 1A. Inner leads 5 extend inwardly of a package over a pellet on which electronic circuits (not illustrated) are mounted. The inner leads 5 extend from outside of the package toward the pellet 1 past an outer edge of the pellet and reach a region where the electronic circuits are fabricated. The pellet 1 and the inner leads 5 are stuck to each other through electrically insulating adhesive tapes 2. The inner leads 5 are bonded to bonding pads 3 formed at a surface of the pellet 1 through wires 4. The inner leads 5, the pellet 1 and the wires 4 are all shielded with an outer packaging resin layer 20. A plurality of outer leads 17 formed continually with the inner leads 5 extend outside the package. The outer leads 17 act as an external terminal for electrically connecting the pellet 1 to an external circuit. As illustrated in FIG. 1A, the outer leads 17 are bent downwardly of the package along the resin layer 20, and further bent outwardly of the package. In other words, the outer leads 17 are shaped gull-wing.

In a conventional plastic-packaged LSI, inner leads are disposed surrounding a pellet, and thus tip ends of the inner leads are located relatively remote away from the pellet. Accordingly, the tip ends of the inner leads are remote away from bonding pads formed at a surface of the pellet, resulting in that it was difficult to make an entire package smaller iii size. However, the semiconductor integrated circuit illustrated in FIG. 1A makes it possible to make an entire package smaller in size, because tip ends of the inner leads 5 extend above the pellet 1.

Besides the gull-wing outer leads 17 as illustrated in FIG. 1A, some LOC-structured TSOP type LSIs have J-shaped outer leads as illustrated in FIG. 1B. It is common to the semiconductor integrated circuits illustrated in FIGS. 1A and 1B that the inner leads horizontally extend from the pellet outwardly of the package, form external terminals as the outer leads, and are bent along the resin layer to thereby form the gull-wing or J-shaped leads.

The above mentioned LOC-structured TSOP type LSIs have a problem that it is difficult to make an entire package smaller in size, and that they are not suitable for accomplishing a higher chip-mount density with which they are mounted onto a substrate such as a print circuit board. Such a problem is posed due to a geometric reason that outer leads acting as external terminals have to be extended outwardly of a resin layer, and further due to a structural reason that a certain distance is required between an outer edge of the resin layer and the pellet for supporting the outer leads in order to give bent-resistance to the outer leads.

Apart from the above mentioned LOC-structured TSOP LSI, there is known a plastic-packaged LSI in which external terminals are designed to have a ball grid array (BGA) structure to thereby attempt to make an entire package smaller in size. In BGA type LSI, an epoxy substrate on which a pellet is to be mounted is formed at a surface thereof with a plurality of solder balls below the pellet, and shielded with resin so that the solder balls are partially exposed outside. The solder balls are directly, electrically connected to pads formed at a surface of the pellet, and the solder balls are located below a lower surface of the pellet, resulting in that it is no longer necessary for external terminals to extend from inside of a resin layer to outside of a package unlike the above mentioned LOC-structured TSOP type LSI. Thus, a BGA structure is suitable for making a package smaller in size.

However, a conventional BGA type LSI poses a problem that, when an epoxy substrate on which a pellet has been already mounted is shielded with resin by means of upper and lower molds, it is impossible to apply a high pressure required for using thermosetting resin. Hence, thermoplastic resin has to be used for shielding a pellet. However, thermoplastic resin is less moisture proof than thermosetting resin, resulting in that it is not avoidable that BGA type LSI are less moisture proof than LOC-structured TSOP type LSI.

In LOC-structured TSOP type LSI, since inner and outer leads extend from inside to outside of a resin layer, moisture contained in a package can escape outside of a package through an interface between the resin layer and the inner and outer leads. On the other hand, BGA type LSI has no path through which moisture contained in a package can escape outside of a package. In this standpoint, it is not avoidable for BGA type LSI to be less moisture proof.

SUMMARY OF THE INVENTION

In view of the above mentioned problems of prior plastic-packaged semiconductor integrated circuits, it is an object of the present invention to provide a plastic-packaged semiconductor integrated circuit which is able to be as small as BGA type LSI in size and which is as moisture proof LOC-structured TSOP type LSI.

There is provided a plastic-packaged semiconductor integrated circuit including (a) an inner lead having a lead-on-chip (LOC) type structure, (b) a ball grid array (BGA) type terminals for electrically connecting the inner lead to an external circuit, and (c) an outer package made of thermosetting resin for shielding the inner lead therein.

More specifically, the plastic-packaged semiconductor integrated circuit may include (a) a pellet on which an electronic circuit is mounted and at a surface of which are formed at least one bonding pad, (b) at least one inner lead disposed partially overlapping the pellet so that one end thereof is located on the inner lead and the other end is exposed outside through a later mentioned thermosetting resin layer, the inner lead being wire-bonded with the bonding pad, (c) a thermosetting resin layer for packaging the pellet and the inner lead therein, and (d) at least one solder ball formed in a hole formed throughout the resin layer so that the solder ball is electrical contact with the inner lead, the solder ball having a head projecting above the resin layer.

There is further provided a method of fabricating a plastic-packaged semiconductor integrated circuit, including the steps of (a) fixating an inner lead of a lead frame on a pellet on which an electronic circuit is mounted, (b) bonding the inner lead to a bonding pad formed on the pellet, (c) shielding the pellet and inner lead with a thermosetting resin layer so that the resin layer is formed with a through hole in communication with the inner lead, (d) filling the through hole with solder so that the solder has a head projecting above the resin layer, and (e) cutting the inner lead outside the resin layer. For instance, the inner lead is cut out along an outer edge of the resin layer in the step (e).

The plastic-packaged semiconductor integrated circuit in accordance with the present invention employs a lead frame made of metal such as ferro alloy and copper alloy for mounting a pellet thereon. The pellet is mounted on a lead frame in LOC structure, and then wire-bonding and resin-shielding are carried out. Thereafter, an outer package made of resin is formed with a plurality of small holes, in which solder balls are formed. The solder balls are electrically connected with bonding pads formed at a surface of the pellet, and thus the solder balls act as external terminals having BGA structure. The plastic-packaged semiconductor integrated circuit having the above mentioned structure provides the following advantages.

1. It is no longer necessary to form outer leads. In the inventive plastic-packaged semiconductor integrated circuit, external terminals are formed at a lower surface of a pellet. Thus, it is no longer necessary to have a space for outer leads to horizontally extend therethrough. In addition, it is also no longer necessary to have a certain distance of a resin layer for supporting outer leads within a package when the outer leads are bent. As a result, it is flow possible to make a package smaller in size.

2. As a lead frame to be employed in the inventive plastic-packaged semiconductor integrated circuit for mounting a pellet thereon is made of metal, it is possible to apply sufficient mold clamping force to molds when a pellet and a lead frame are shielded with resin. Accordingly, thermosetting resin having superior moisture-proof properties can be employed for shielding a pellet and a lead frame therewith, which contributes to an improved of moisture proof package.

3. In the inventive plastic-packaged semiconductor integrated circuit, an inner lead is exposed outside through a resin layer. Thus, moisture contained in a package can escape through an interface between a resin layer and an inner lead, which contributes to further improvement of moisture-proof properties of a package.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings in which.

DESCRIPTION OF THE PREFERRED EMBODIMENTS

Figure 1A:
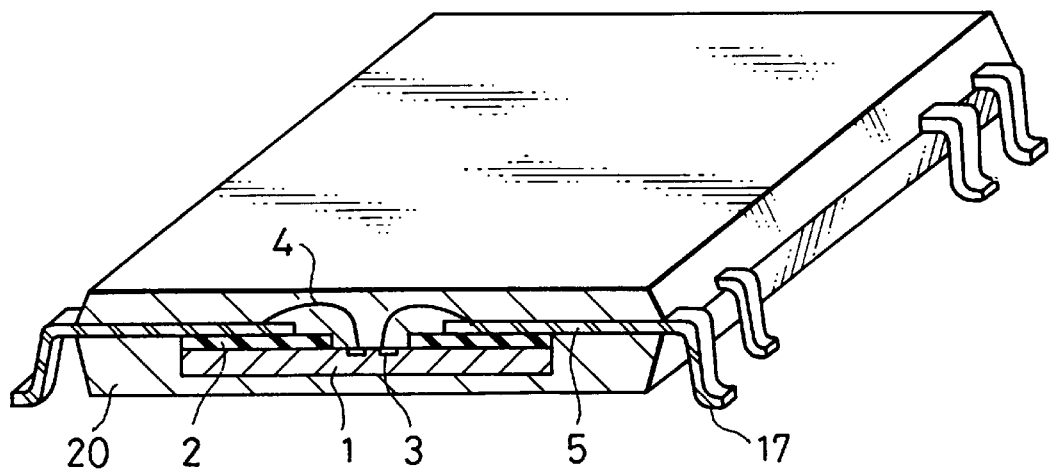
FIG. 1A is a perspective view illustrating a conventional LOC-structured TSOP type integrated circuit having gull-wing outer leads.
Figure 1B:
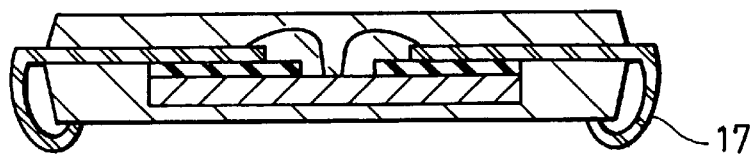
FIG. 1B is a perspective view illustrating a conventional LOC-structured TSOP type integrated circuit having J-shaped outer leads.
Figure 2A:
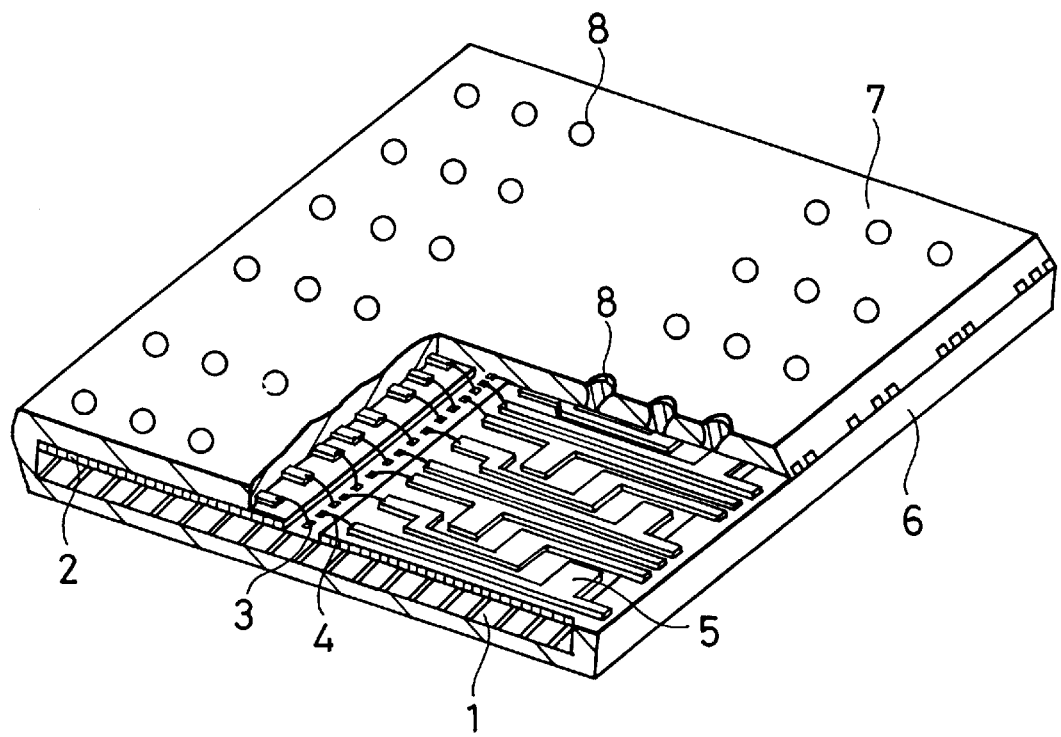
FIG. 2A is a perspective view illustrating a plastic-packaged semiconductor integrated circuit made in accordance with the first embodiment of the present invention with portions broken away for the sake of clarity.
Figure 3:
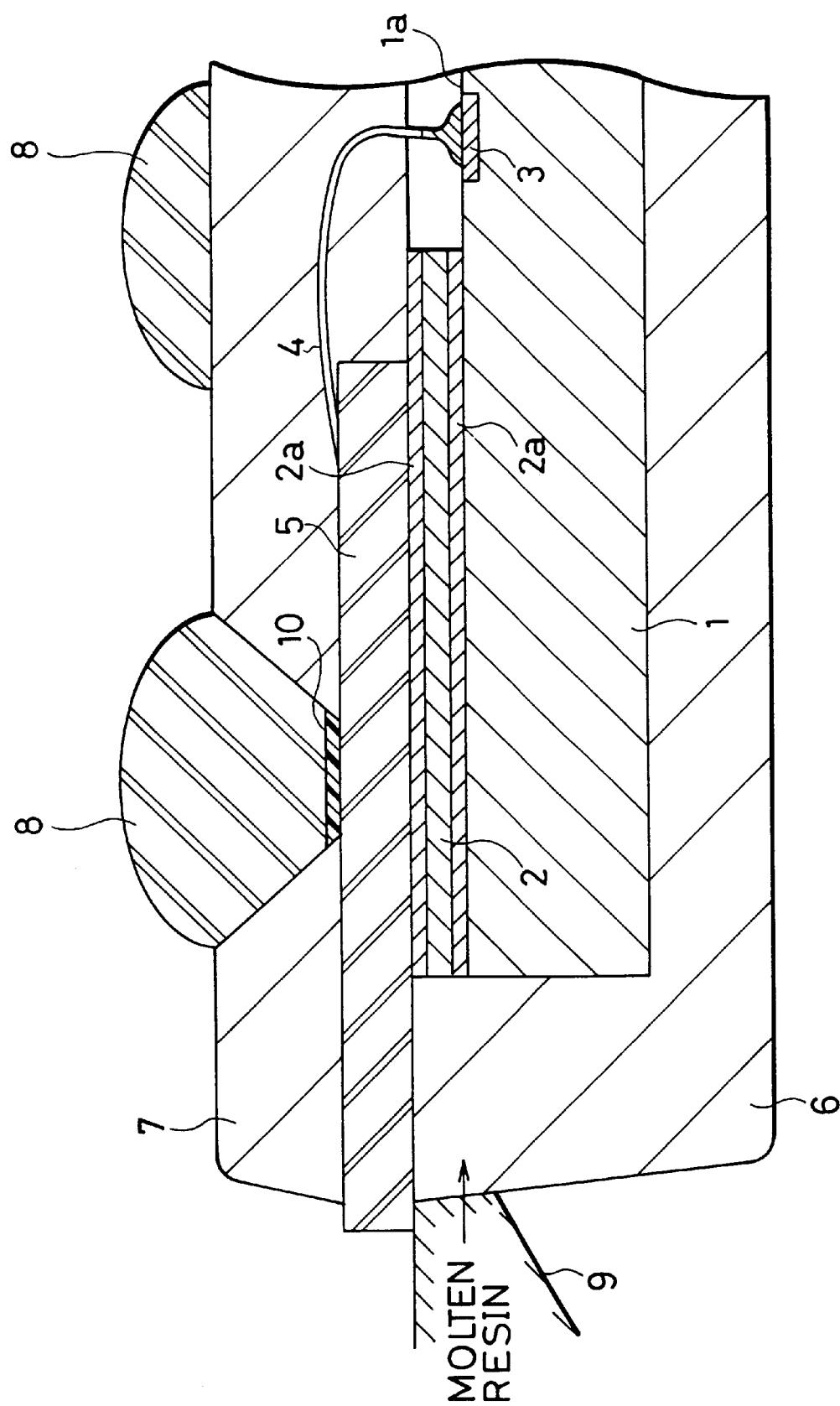
FIG. 3 is a partially enlarged view of the circuit illustrated in FIG. 1A.

With reference to FIGS. 2A and 3, a plastic-packaged semiconductor integrated circuit in accordance with the first embodiment is fabricated as follows.

A pellet 1 has an upper surface 1a (see FIG. 3) on which electronic circuits (not illustrated) are formed and at which a plurality of bonding pads 3 are formed. First, adhesive tapes 2 are stuck onto the upper surface 1a of the pellet 1 except a region where the bonding pads 3 are formed. The adhesive tapes 2 are made of electrically insulating material, and have adhesive layers 2a (see FIG. 3) on upper and lower surfaces thereof. Inner leads 5 of a lead frame are fixedly stuck onto the upper surface 1a of the pellet 1 through the adhesive tape 2.

Then, the inner leads 5 are bonded to the bonding pads 3 through wires 4. Thereafter, upper and lower packages 6 and 7 are molded with resin by employing metal molds, so that the pellet 1, the inner leads 5 and the wires 4 are shielded with resin. Herein, thermosetting resin is employed for shielding. A lower metal mold is formed with small raised portions so that the lower package 7 is formed with small holes above the inner leads 5 after resin-shielding has been completed.

Then, solder balls are mounted in the small holes of the lower package 7, and heated at a high temperature to thereby reflow. Thus, as illustrated in FIG. 3, there are formed solder balls 8 in the small holes of the lower package 7. Since the small holes are located above the inner leads 5, the solder balls 8 are direct contact with the inner leads 5. The thus formed solder balls 8 act as external terminals.

Then, the inner leads 5 extending from inside to outside of the plastic-packaged circuit are cut out along the upper and lower packages 6 and 7. Thus, the plastic-packaged semiconductor integrated circuit in accordance with the first embodiment is completed. The thus completed integrated circuit has LOC structure employing a metal lead frame therein, and BGA type external terminals. The upper and lower packages 6 and 7 for packaging the integrated circuit therein are made of thermosetting resin, and cut-out ends of the inner leads 5 are exposed outside between the upper and lower resin packages 6 and 7.

Figure 2B:
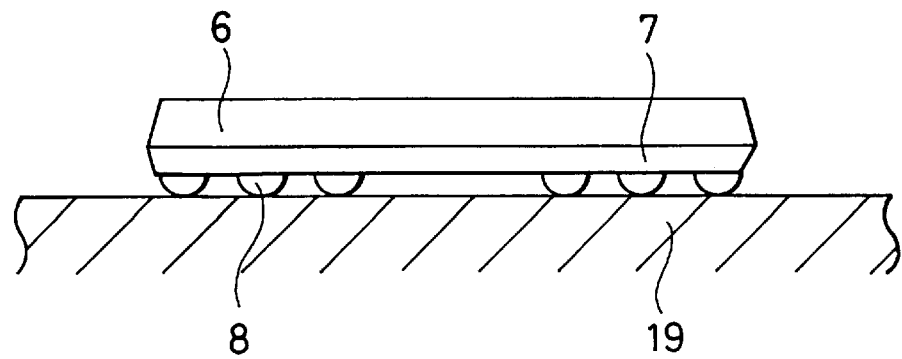
FIG. 2B is a side view illustrating that the plastic-packaged semiconductor integrated circuit illustrated in FIG. 2A is mounted on a substrate.

As illustrated in FIG. 2B, when the thus fabricated plastic-packaged semiconductor integrated circuit is mounted on a substrate such as a printed circuit board 19, the solder balls 8 are molten by reflow melting, and then bonded to pads (not illustrated) formed at a surface of the printed circuit board 19.

Hereinbelow are explained respective steps of a method of fabricating the above mentioned plastic-packaged semiconductor integrated circuit, with reference to FIGS. 4A to 4H.

Figure 4A:
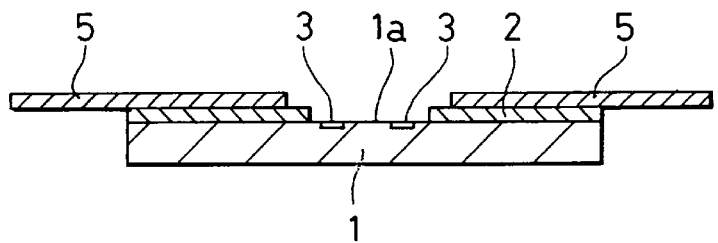
FIGS. 4A to 4H are cross-sectional or side views of the circuit illustrated in FIG. 1A, showing respective steps of a method of fabricating the circuit.

First, as illustrated in FIG. 4A, the pellet 1 is prepared so that the upper surface 1a on which the bonding pads 3 are formed faces upwardly. Then, the pressure sensitive adhesive double coated tape 2 are adhered onto the upper surface 1a except onto the bonding pads. Then, the inner leads 5 are put on and compressed onto the adhesive tape 2 to thereby fix the inner leads 5 on the pellet 1 through the adhesive tape 2.

Figure 4B:
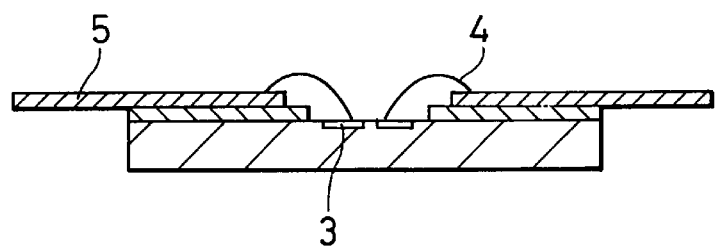

Then, as illustrated in FIG. 4B, the inner leads 5 are bonded to the bonding pads 3 through the wires 4.

Figure 4C:
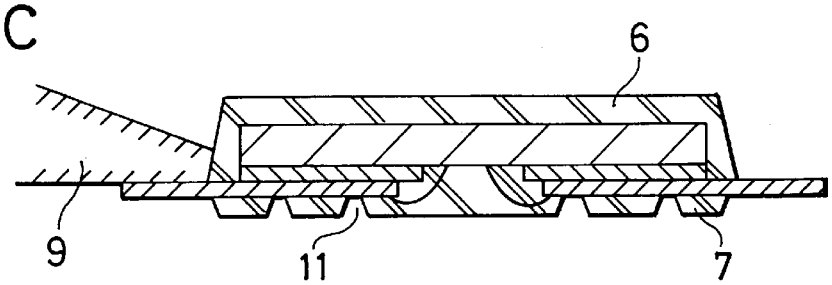
Figure 4D:
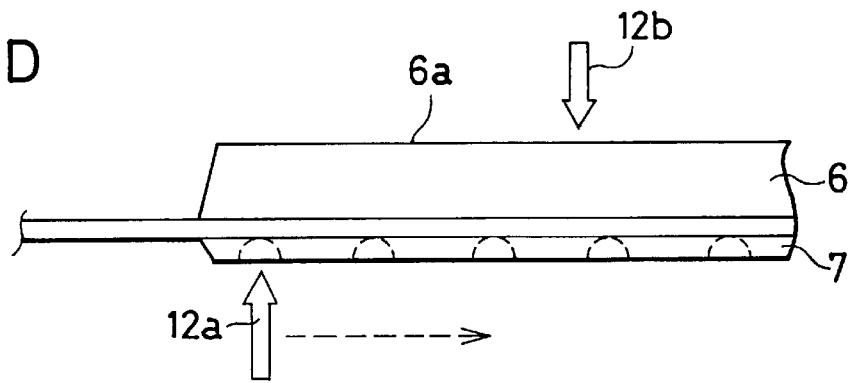

Thereafter, the pellet 1 with the inner leads 5 is turned upside down, and set into upper and lower molds (not illustrated) so that the wires 4 are within a lower mold. Then, transfer molding technique is carried out. That is, as illustrated in FIG. 4C, thermosetting epoxy resin under pressure is introduced into a cavity defined by the upper and lower molds through a gate 9. The lower mold is formed with a plurality of small raised portions so that the lower package 7 is formed with small holes above the inner leads 5. Thus, the lower packages 7 is formed with a plurality of holes 11 below the inner leads 5 after resin-shielding has been completed.

When resin-shielding is carried out, there is also formed a thin resin film 10 (see FIG. 3) at a bottom of the holes 11 on a surface of the inner leads 5. These thin resin films 10 are removed by means of laser beam 12a or other suitable means.

A seal is put to an upper surface 6a of the upper package 6, namely a surface opposite to a surface at which the holes 11 are formed, by means of another laser beam 12b. The seal may be put simultaneously with or after the removal of the thin resin film 10.

Figure 4E:
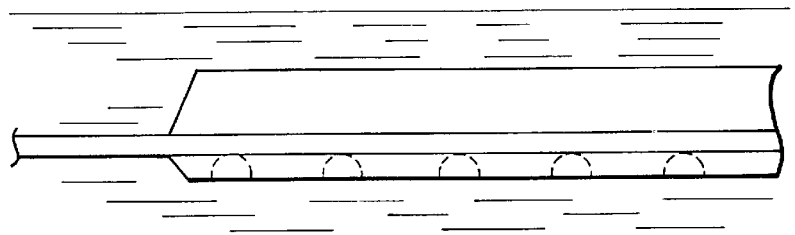

Then, a pretreatment is carried out to the resin shielded integrated circuit in order to remove oxides sticking to a surface the inner leads 5 exposed outside through the holes 11. For instance, the resin shielded integrated circuit is washed with or immersed into hydrogen peroxide solution. Then, as illustrated in FIG. 4E, the resin packaged integrated circuit is immersed in flux bath in order to enhance solderability of the solder balls 8.

Figure 4F:
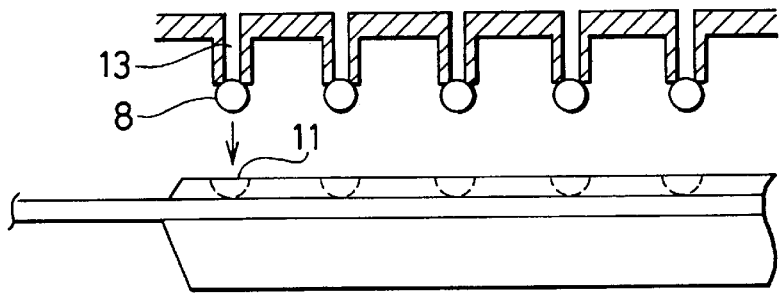

Then, the resin shielded package is again turned upside down. Hence, a surface at which the holes 11 are formed now faces upwardly. Then, as illustrated in FIG. 4F, the solder balls 8 are supplied to the holes 11 of the lower package 7 by employing a vacuum absorber 13.

Figure 4G:
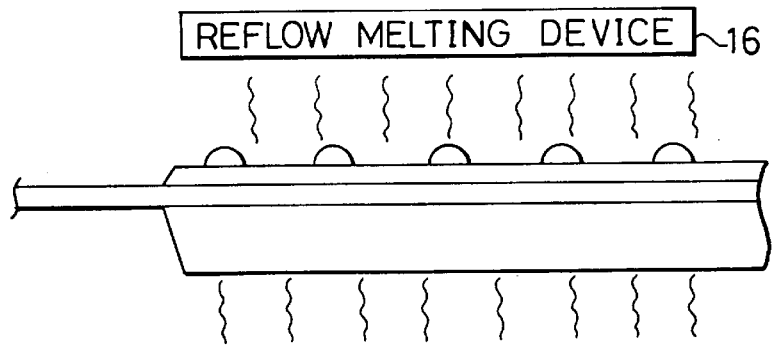

Then, the solder balls 8 are made to melt by means of a reflow melting device 16, as illustrated in FIG. 4G, and thus the molten solder balls 8 are bonded to the inner leads 5.

Figure 4H:
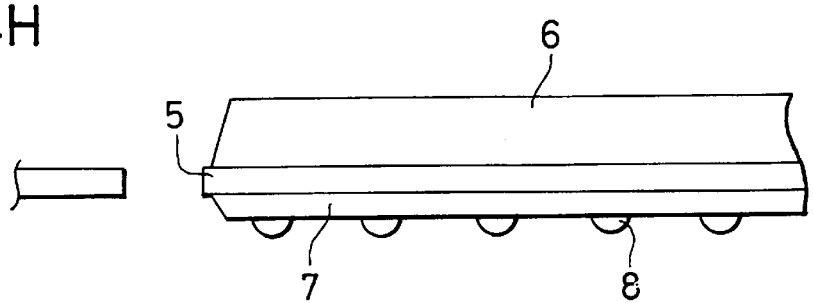

Finally, as illustrated in FIG. 4H, the inner leads 5 are cut out along the upper and lower packages 6 and 7 by means of a cutting die. Thus, there is completed the plastic-packaged semiconductor integrated circuit in accordance with the first embodiment.

Figure 5:
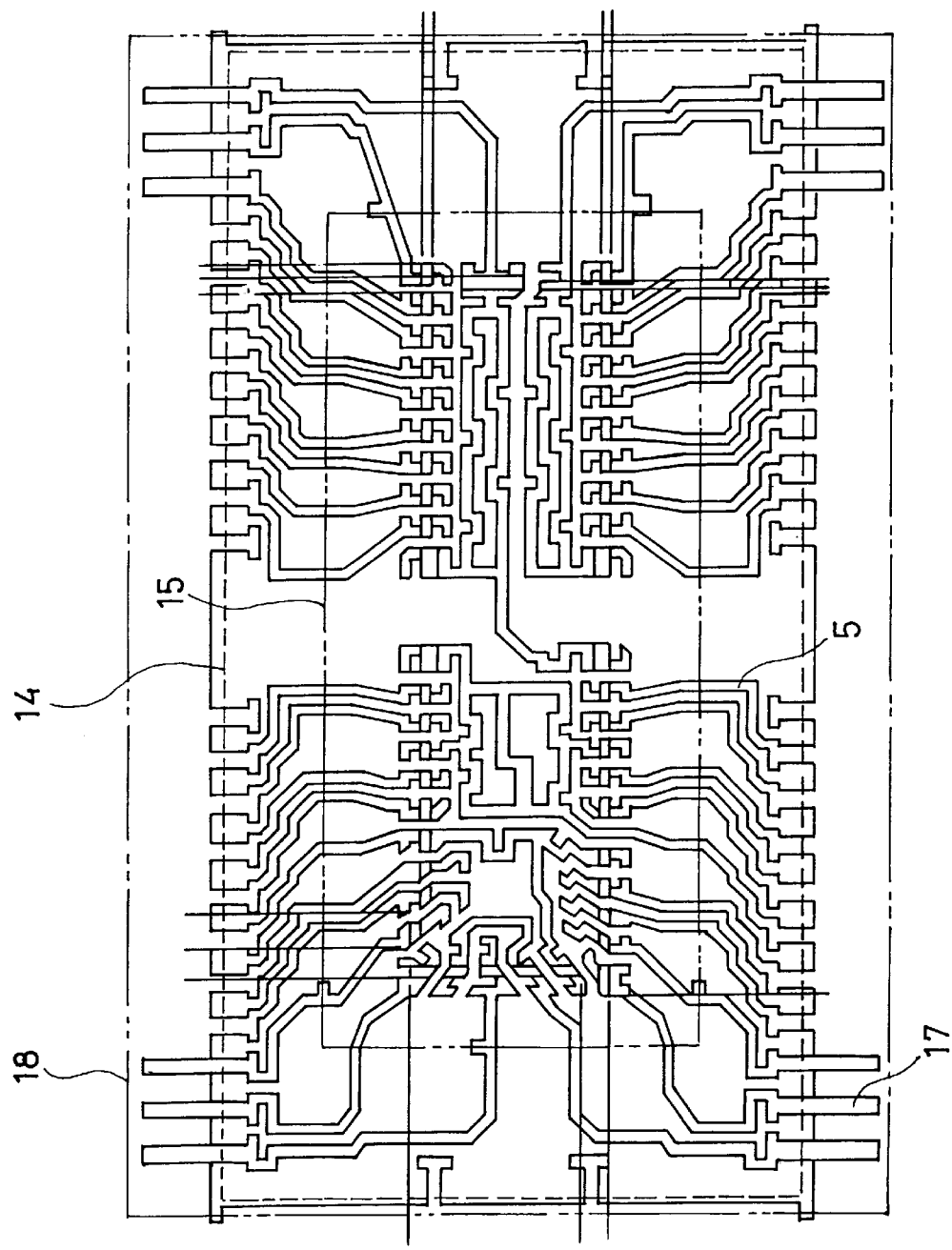
FIG. 5 is a plan view of both the plastic-packaged semiconductor integrated circuit made in accordance with the first embodiment and a conventional LOC-structured TSOP type semiconductor integrated circuit for comparing them with each other in the standpoint of package area.

FIG. 5 shows the comparison in package area between the plastic-packaged semiconductor integrated circuit made in accordance with the first embodiment and a conventional LOC-structured TSOP type semiconductor integrated circuit. In the first embodiment, since the BGA type solder balls are all located with in the inner lead area, an outline 15 of the package including the external terminals (namely, the BGA type solder balls 8) is coextensive with an outline of the outer packaging resin layer (namely, the upper and lower packages 6 and 7). On the other hand, as mentioned earlier, a conventional plastic-packaged integrated circuit has to have an extra marginal space in a outer packaging resin layer for the inner leads 5 to be buried therethrough in order to have a strength against the bending of the outer leads 17. Thus, an outline 14 of the outer packaging resin layer cannot avoid to become larger accordingly. Specifically, the outline 14 of the conventional plastic-packaged integrated circuit has almost twice as much area compared with an area of the outline 15 of the plastic-packaged integrated circuit made in accordance with the first embodiment. Considering the outer leads 17 projecting outwardly from the outline 14, an area 18 of the conventional entire package including the outer leads 17 is almost 2.5 times greater than an area of the outline 15 of the first embodiment.

As explained earlier in connection with the preferred embodiment, the plastic-packaged semiconductor integrated circuit in accordance with the present invention has internal LOC structure where a metal lead frame is employed and BGA type external terminals. Thus, the inventive plastic-packaged semiconductor integrated circuit makes it possible to employ a metal lead frame, on which a pellet is to be mounted, without outer leads acting as external terminals unlike a conventional LOC-structured TSOP type semiconductor integrated circuit. Thus, it is no longer necessary for a package to have an extra space through which outer leads extend outwardly thereof, and in addition, it is also no longer necessary for a package to have a certain distance of an outer packaging resin layer to be used for supporting outer leads. As a result, the present invention makes it possible to make a package smaller in size.

In addition, an outer packaging resin layer can be made of thermosetting resin that is highly moisture proof, and inner leads are exposed outside at their one ends through the outer packaging resin layer, so that moisture contained in a package can escape through the inner leads. Thus, though the inventive plastic-packaged semiconductor integrated circuit has BGA type external terminals, it ensures high moisture-proof properties and a smaller size.

The present invention provides a plastic-packaged semiconductor integrated circuit having high moisture-proof properties which is a merit of LOC-structured TSOP type integrated circuit and a small size which is a merit of BGA type integrated circuit, contributing to higher reliability and a smaller size of electronic devices.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A plastic-packaged semiconductor integrated circuit comprising:

(a) a pellet within which is formed at least one bonding pad, said pellet having a perimeter;

(b) at least one inner lead disposed partially overlapping said pellet;

(c) a thermosetting resin layer for packaging said pellet and said inner lead therein, so that said one inner lead partially overlaps said pellet by one end of said inner lead being located on said pellet and the other end being exposed outside through said thermosetting resin layer, said inner lead being wire-bonded with a bonding wire to said bonding pad; and (d) at least one solder ball having a head projecting through an exterior surface of said resin layer and formed in a hole within said resin layer so that said solder ball is in electrical contact with said inner lead, wherein the entirety of each of said at least one solder ball and the corresponding bonding wire is located within an area defined by said pellet perimeter, spaced apart from said pellet.

* * * * *